(12) United States Patent
Horiike et al.

(10) Patent No.: US 10,899,108 B2
(45) Date of Patent: Jan. 26, 2021

(54) LAMINATES AND GAS BARRIER FILMS

(71) Applicant: TOPPAN PRINTING CO., LTD., Tokyo (JP)

(72) Inventors: Takafumi Horiike, Tokyo (JP); Jin Sato, Tokyo (JP); Nao Takashima, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 5 days.

(21) Appl. No.: 15/730,806

(22) Filed: Oct. 12, 2017

(65) Prior Publication Data

US 2018/0036998 A1 Feb. 8, 2018

Related U.S. Application Data

(63) Continuation of application No. PCT/JP2016/062112, filed on Apr. 15, 2016.

(30) Foreign Application Priority Data

Apr. 16, 2015 (JP) ................................. 2015-084031
Apr. 20, 2015 (JP) ................................. 2015-085812

(51) Int. Cl.
*B32B 7/02* (2019.01)
*B32B 7/06* (2019.01)
(Continued)

(52) U.S. Cl.
CPC .................. *B32B 7/02* (2013.01); *B32B 7/06* (2013.01); *B32B 7/12* (2013.01); *B32B 9/00* (2013.01);
(Continued)

(58) Field of Classification Search
CPC .... B32B 7/02; B32B 7/12; B32B 7/06; B32B 37/12; B32B 27/36; B32B 27/32;
(Continued)

(56) References Cited

U.S. PATENT DOCUMENTS

2004/0195967 A1* 10/2004 Padiyath ................. B32B 27/08
313/512
2008/0182101 A1* 7/2008 Carcia ................... C23C 16/403
428/332
(Continued)

FOREIGN PATENT DOCUMENTS

EP     3081375 A1    10/2016
JP     2011-173261    9/2011
(Continued)

OTHER PUBLICATIONS

Espacenet Translation of JP 2012-182303 (Year: 2019).*
(Continued)

*Primary Examiner* — Michael Zhang
(74) *Attorney, Agent, or Firm* — Foley & Lardner LLP

(57) ABSTRACT

A laminate includes a substrate; an atomic layer deposition film that is disposed on at least one surface of the substrate, and is made of an inorganic material; and a protective film that is bonded to and covers the atomic layer deposition film, and has an adhesive layer that is in contact with the atomic layer deposition film.

11 Claims, 4 Drawing Sheets

(51) Int. Cl.
  *C23C 16/30* (2006.01)
  *C23C 16/56* (2006.01)
  *B32B 9/00* (2006.01)
  *B32B 27/32* (2006.01)
  *C23C 16/455* (2006.01)
  *B32B 37/12* (2006.01)
  *B32B 27/30* (2006.01)
  *B32B 27/36* (2006.01)
  *B32B 7/12* (2006.01)
  *C23C 14/10* (2006.01)
  *C23C 16/44* (2006.01)
  *C23C 16/54* (2006.01)
  *B32B 37/24* (2006.01)
  *B05D 3/06* (2006.01)

(52) U.S. Cl.
  CPC ............ *B32B 27/306* (2013.01); *B32B 27/32* (2013.01); *B32B 27/36* (2013.01); *B32B 37/12* (2013.01); *C23C 14/10* (2013.01); *C23C 16/30* (2013.01); *C23C 16/44* (2013.01); *C23C 16/45525* (2013.01); *C23C 16/45544* (2013.01); *C23C 16/545* (2013.01); *C23C 16/56* (2013.01); *B05D 3/066* (2013.01); *B32B 2037/246* (2013.01); *B32B 2264/102* (2013.01)

(58) Field of Classification Search
  CPC ... B32B 27/306; B32B 9/00; B32B 2037/246; B32B 2264/102; C23C 16/45525; C23C 16/4554; C23C 16/44; C23C 16/545; C23C 16/56; C23C 16/30; C23C 14/10; B05D 3/066
  See application file for complete search history.

(56) References Cited

U.S. PATENT DOCUMENTS

| | | | | |
|---|---|---|---|---|
| 2011/0206900 A1* | 8/2011 | Iwase | ...................... | B32B 27/08 428/141 |
| 2012/0003448 A1* | 1/2012 | Weigel | .............. | B32B 17/10018 428/212 |
| 2012/0227809 A1* | 9/2012 | Bharti | ............... | H01L 31/02167 136/259 |
| 2013/0009264 A1* | 1/2013 | Pankow | ............ | B32B 17/10018 257/433 |
| 2015/0064429 A1* | 3/2015 | Iwaya | ........................ | B32B 7/12 428/213 |
| 2015/0212350 A1* | 7/2015 | Niiyama | ................. | B32B 27/00 349/122 |
| 2015/0243816 A1* | 8/2015 | Nachtigal | ............... | B32B 27/06 136/259 |
| 2016/0265111 A1* | 9/2016 | Horiike | ................. | C23C 16/405 |

FOREIGN PATENT DOCUMENTS

| | | | |
|---|---|---|---|
| JP | 2012-096432 | | 5/2012 |
| JP | 2012-182303 | | 9/2012 |
| JP | 2012182303 A | * | 9/2012 |
| JP | 2012-228859 | | 11/2012 |
| JP | 2014-148753 | | 8/2014 |
| JP | 2015-003464 | | 1/2015 |
| WO | WO-2013/015417 | | 1/2013 |
| WO | WO-2014-028677 A1 | | 2/2014 |
| WO | WO-2014/084686 | | 6/2014 |
| WO | WO-2014/123201 | | 8/2014 |

OTHER PUBLICATIONS

International Search Report Issued in International Application No. PCT/JP2016/062112 dated Jul. 19, 2016.
Partial European Search Report dated Dec. 11, 2018 in corresponding application No. 16780139.8.
3M Polyester Protective Tape 1614, 2004.
Office Action dated Apr. 28, 2020 for corresponding Japanese Patent Application No. 2017-512597.

* cited by examiner

LAMINATES AND GAS BARRIER FILMS

CROSS-REFERENCE TO RELATED PATENT APPLICATIONS

This application is a continuation application filed under 35 U.S.C. § 111(a) claiming the benefit under 35 U.S.C. §§ 120 and 365(c) of International Application No. PCT/JP2016/062112, filed on Apr. 15, 2016, which is based upon and claims the benefit of priority of Japanese Patent Application No. 2015-084031, filed on Apr. 16, 2015 and Japanese Patent Application No. 2015-085812, filed on Apr. 20, 2015, the entireties of which are hereby incorporated by reference.

TECHNICAL FIELD

The present invention relates to laminates and gas barrier films, and more specifically, laminates having an atomic layer deposition film formed on an outer surface of a substrate by an atomic layer deposition (ALD) and gas barrier films having the laminate.

BACKGROUND

Methods for forming a thin film on the surface of an object using a gaseous phase in which substances can move at the atomic or molecular level like gases include chemical vapor deposition (CVD) methods and physical vapor deposition (PVD) methods.

PVD methods includes, for example, vacuum vapor deposition and sputtering. Sputtering, which enables production of a high-quality thin film with a uniform film quality and thickness, has been commonly applied to display devices such as liquid crystal displays.

CVD is a process of growing a solid thin film by introducing a source gas into a vacuum chamber and decomposing or reacting one or two types of gas on a substrate by means of thermal energy.

In this process, plasma or catalyst reaction may be used in combination to promote the reaction during film formation or decrease reaction temperature.

CVD using a plasma reaction is called plasma enhanced CVD (PECVD). Further, CVD using a catalyst reaction is called Cat-CVD.

These CVD processes can reduce deficiencies in film formation, and are therefore applied to production processes of semiconductor devices (for example, formation of a gate insulating film) or the like.

In recent years, atomic layer deposition (ALD) (hereinafter, referred to as "ALD") has been attracting attention.

ALD is a method in which a substance adsorbed on a surface is deposited layer by layer at the atomic level by means of chemical reaction on the surface. ALD is classified as a type of CVD.

Typical CVD (general CVD) is a process of growing a thin film by reacting a single gas or a plurality of gases simultaneously on a substrate. On the other hand, ALD is a specific process of deposition for growing thin films at the atomic level layer by layer by means of adsorption on the substance surface and subsequent chemical reaction by alternately using a highly active gas or precursor (such as tri-methyl aluminum (TMA); hereinafter, "first precursor") and a reactive gas (in ALD, also called a precursor; hereinafter, "second precursor").

Specifically, film formation by ALD is conducted as follows.

First, precursors are adsorbed onto the substrate to form only one layer, and then unreacted precursors are purged by using a self-limiting effect (a phenomenon during a surface adsorption on the substrate that gas is no longer adsorbed onto a surface when the surface is covered by a certain type of gas) (first step).

Then, a reactive gas is introduced into a chamber to oxidize or reduce the above precursors to thereby form only one layer of a thin film having a desired composition, and after that, the reactive gas is purged (second step).

In ALD, the above first and second steps are taken as one cycle, which is repeated to grow thin films on the substrate.

Accordingly, thin films grow in two dimensions through ALD. Further, ALD has fewer deficiencies in film deposition compared with the conventional vacuum vapor deposition or sputtering and the conventional CVD.

For these reasons, the atomic layer deposition film immediately after it is formed by ALD is expected to have high gas barrier properties with a water vapor transmission rate (WVTR) of the order of $10^{-3}$ g/(m$^2$·day), or even not more than of the order of $10^{-3}$ g/(m$^2$·day), in contrast to the film immediately after it is formed by the vacuum vapor deposition or sputtering having WVTR of the order of $10^{-1}$ g/(m$^2$·day). Accordingly, laminates having an atomic layer deposition film formed by atomic layer deposition on the outer surface of the substrate are used for gas barrier films having high gas barrier properties, and are expected to be applied to a variety of fields such as a packaging field for food and pharmaceutical products and an electronics field.

As one type of ALD, there is a process that uses plasma to enhance reaction in the step of decomposing a second precursor and reacting the decomposed second precursor with a first precursor which has been adsorbed on the substrate. This process is called plasma enhanced ALD (PEALD) or simply plasma ALD.

The ALD technique was proposed by Dr. Tuomo Suntola in Finland in 1974. In general, as described in ITRS (International Technology Roadmap for Semiconductors), ALD has been applied to a semiconductor device manufacturing field (for example, in a gate insulating film forming process) since it enables high quality and high density film formation.

Unlike the other film formation methods, ALD has no shadowing effect (a phenomenon that causes uneven film formation due to sputtering particles being obliquely incident onto the substrate surface). As a result, film formation can be performed if there is a gap that allows gas to enter.

Accordingly, ALD is expected to be applied to micro electro mechanical systems (MEMS)-related technologies, which are used for covering lines and holes on the substrate which have a high aspect ratio, that is, a large ratio of depth to width, and covering three-dimensional structures.

Examples of the substrate on which a thin film is formed by using the above ALD include a small plate-shaped substrate such as wafer and photomask, a substrate having a large area and no flexibility (for example, glass substrate), and a substrate having a large area and flexibility such as a film.

In mass production facilities for manufacturing a thin film on these substrates, a variety of processes have been proposed and put to practical use for handling the substrates, which are different in ease of handling, film formation quality, and the like.

For example, film formation apparatuses used for forming a thin film on a wafer include a sheet-type film formation apparatus, batch-type film formation apparatus and the like. In a sheet-type film formation apparatus, a film is formed on a sheet of wafer which has been transported into a chamber in the film formation apparatus, and then the sheet is replaced with a new substrate for subsequent film formation. In a batch type film formation apparatus, a plurality of substrates is collectively mounted in the chamber for performing the same film formation onto the respective wafers.

Further, film formation apparatuses used for forming a thin film on a glass substrate include an in-line film formation apparatus that performs film formation in a concurrent manner while successively transporting glass substrates to a portion of a deposition source.

Moreover, film formation apparatuses used for forming a thin film on a flexible substrate include a coating film formation apparatus that uses a roll-to-roll method, which performs film formation while paying out a flexible substrate from a roller and taking up the flexible substrate by another roller. (For example, see PTL 1).

PTL 1 discloses forming an atomic layer deposition film on both surfaces of the substrate by atomic layer deposition by using a film formation apparatus which includes a vacuum chamber evacuated at a predetermined pressure, an inner chamber filled with a purge gas, and a roll-to-roll type transportation mechanism disposed in the vacuum chamber and configured to transport the substrate film.

CITATION LIST

Patent Literature

PTL 1: JP 2012-96432 A

SUMMARY OF THE INVENTION

Technical Problem

The atomic layer deposition film may be easily damaged by an external force when not covered by another layer. Therefore, flaws (including pinholes) may be easily formed by an external force in an atomic layer deposition film formed by the method described in PTL 1, that is, first and second barrier layers (hereinafter, simply referred to as "atomic layer deposition film"). Flaws formed in the atomic layer deposition film by some external force may extend to the substrate.

When such flaws are formed in the atomic layer deposition film and extend to the substrate, gas may leak in and out through the flaws between the atomic layer deposition film and the substrate. Consequently, gas barrier properties of the laminate may decrease.

Further, when the laminate having such a fragile atomic layer deposition film is produced, it is important to prevent the atomic layer deposition film from coming into contact with a rigid material after the atomic layer deposition film is formed. If a rigid material comes into contact with the atomic layer deposition film, flaws may be formed in the atomic layer deposition film, which decreases the gas barrier properties.

When a laminate is produced and retrieved by using a coating film formation apparatus using a roll-to-roll method described in PTL 1, a gas barrier film is wound into a roll shape while the roller surface of the transportation roller is in contact with the surface of the atomic layer deposition film. This causes a problem that the surface of the atomic layer deposition film may be damaged by the roller surface, and gas barrier properties of the laminate decreases.

That is, there is difficulty in achieving the high gas barrier properties, which is characteristic to the atomic layer deposition film (specifically, water vapor transmission rate (WVTR) of the order of $10^{-3}$ g/(m$^2$·day) or less).

The atomic layer deposition film can exhibit higher barrier performance compared with the film formed by vacuum vapor deposition, sputtering or the like. However, since the atomic layer deposition film is a thin film and exhibits high barrier performance, it seems that even a flaw of a level that has been previously accepted may be a large cause of deterioration in barrier performance.

Accordingly, the above problem is specific to the atomic layer deposition film having high gas barrier properties.

Therefore, the present invention has an object of providing a laminate and a gas barrier film that can prevent occurrence of flaws in the atomic layer deposition film which is disposed on the outer surface of the substrate.

Solution to Problem

In order to solve the above problem, a laminate according to a first aspect of the present invention includes a substrate; an atomic layer deposition film that is disposed on at least one surface of the substrate, and is made of an inorganic material; and a protective film that is bonded to and covers the atomic layer deposition film, and has an adhesive layer that is in contact with the atomic layer deposition film.

An adhesive force of the adhesive layer may be in a range of 10 cN/25 mm or more and less than 200 cN/25 mm.

When the adhesive force of the adhesive layer is less than 10 cN/25 mm, the adhesive force of the protective film to the outer surface of the atomic layer deposition film cannot be sufficiently obtained.

In this case, when the protective film is hit by an object, the protective film is peeled off from the outer surface of the atomic layer deposition film. Further, when the substrate having the atomic layer deposition film formed on one surface is taken up by a roll-to-roll type transportation device, the protective film may be displaced from the outer surface of the atomic layer deposition film, and the outer surface of the atomic layer deposition film is rubbed with the protective film. As a result, the outer surface of the atomic layer deposition film is damaged, which causes difficulty in obtaining high gas barrier properties.

On the other hand, when the adhesive force of the adhesive layer is 200 cN/25 mm or more, the adhesive force is too large and makes it difficult to peel the protective film from the outer surface of the atomic layer deposition film with ease. As a result, when the laminate according to the above aspect is used as a type of laminate that is used by peeling off the protective film, a large amount of force is required to peel the protective film. Such a large force may damage the atomic layer deposition film and the substrate when applied to the substrate on which the atomic layer deposition film is formed.

Therefore, by setting the adhesive force of the adhesive layer to be at 10 cN/25 mm or more and less than 200 cN/25 mm as in the above aspect, occurrence of flaws (including pinholes) in the outer surface of the atomic layer deposition film can be prevented (a sufficient protective effect of the protective film to the outer surface of the atomic layer deposition film can be obtained) while the protective film can be easily peeled off from the outer surface of the atomic layer deposition film without damaging the atomic layer deposition film and substrate.

Further, in the laminate according to the first aspect, a thickness of the protective film may be in a range of 10 μm or more and 200 µm or less, and a thickness of the adhesive layer in the protective film may be in a range of 5 µm or more and 30 µm or less.

When the thickness of the protective film is less than 10 µm, it is difficult to handle the protective film. Accordingly, a crease may be created on the protective film when the protective film is bonded to the outer surface of the atomic layer deposition film. Such a crease of the protective film is transferred to the substrate on which the atomic layer deposition film is formed when the laminate is taken up by a take-up roller of a roll-to-roll type transportation device. As a result, deformation, distortion, rubbing or the like occurs on the laminate and damages the atomic layer deposition film, leading to a decrease in barrier properties of the atomic layer deposition film.

On the other hand, when the thickness of the protective film is larger than 200 µm, a large amount of winding tension (larger than that for a thin protective film) needs to be applied to the laminate when the laminate is taken up by a take-up roller of a roll-to-roll type transportation device. Such a large amount of winding tension applied on the laminate causes tight winding of the laminate which has been taken up by the take-up roller, and generates a large force in the core direction of the take-up roller.

This may damage the atomic layer deposition film of the laminate adjacent to the core of the take-up roller, leading to a decrease in barrier properties of the atomic layer deposition film.

Further, when the thickness of the adhesive layer is less than 5 µm, the adhesiveness of the protective film to the outer surface of the atomic layer deposition film becomes insufficient, which may cause the protective film to be peeled off from the outer surface of the atomic layer deposition film.

On the other hand, when the thickness of the adhesive layer is more than 30 µm, it is difficult to ensure a sufficient thickness of the protective film that protects the outer surface of the atomic layer deposition film, leading to a decrease in protective performance to the outer surface of the atomic layer deposition film.

Therefore, damage to the atomic layer deposition film can be reduced by having the protective film with the thickness of 10 µm or more and 200 µm or less, and the adhesive layer in the protective film with the thickness of 5 µm or more and 30 µm or less.

Accordingly, it is possible to reduce a decrease in gas barrier properties of the atomic layer deposition film after the laminate is taken up by using the take-up roller.

Further, in the laminate according to the first aspect, a thickness of the atomic layer deposition film may be in the range of 2 nm or more and 500 nm or less.

When the thickness of the atomic layer deposition film is less than 2 nm, the atomic layer deposition film is too thin to function as a barrier film. This causes a risk that sufficient barrier properties cannot be obtained.

On the other hand, when the thickness of the atomic layer deposition film is larger than 500 nm, a stress due to the thick atomic layer deposition film concentrates on the atomic layer deposition film. Consequently, a crack may occur on the atomic layer deposition film, leading to a decrease in barrier properties of the atomic layer deposition film. Further, when the thickness of the atomic layer deposition film is larger than 500 nm, there is a risk of increase in the cost and extension in the film formation time.

Accordingly, when the thickness of the atomic layer deposition film is in the range of 2 nm or more and 500 nm or less, the atomic layer deposition film with sufficient barrier properties can be obtained while reducing the cost, film formation time and crack occurrence.

Further, in the laminate according to the first aspect, the atomic layer deposition film may be an inorganic single-layer film of an inorganic oxide film, inorganic nitride film or an inorganic oxynitride film, an inorganic laminated film made of two or more of the inorganic oxide film, the inorganic nitride film and the inorganic oxynitride film, or an inorganic mixed film. The inorganic oxide film, the inorganic nitride film, the inorganic oxynitride film, and the inorganic mixed film may include at least one selected from the group consisting of Al, Ti, Si, Zn, Sn, Zr, Hf, and Ta.

By providing the inorganic oxide film, the inorganic nitride film, the inorganic oxynitride film, and the inorganic mixed film that include at least one of Al, Ti, Si, Zn, Sn, Zr, Hf, and Ta to constitute the atomic layer deposition film, the atomic layer deposition film having high water vapor barrier properties and high durability can be obtained.

According to the laminate of the above aspect, occurrence of flaws in the outer surface of the atomic layer deposition film can be prevented (a sufficient protective effect of the protective film to the outer surface of the atomic layer deposition film can be obtained) while the protective film can be easily peeled off from the outer surface of the atomic layer deposition film without damaging the atomic layer deposition film and substrate.

In the laminate according to the first aspect, an adhesive force of the adhesive layer may be in the range of 200 cN/25 mm or more.

The thickness of the protective film may be 10 µm or more and 200 µm or less.

The thickness of the atomic layer deposition film may be in the range of 2 nm or more and 500 nm or less.

The atomic layer deposition film may be an inorganic oxide film, an inorganic nitride film, an inorganic oxynitride film or a mixed film of the inorganic oxide film, the inorganic nitride film and the inorganic oxynitride film.

A gas barrier film according to a second aspect of the present invention includes the laminate according to the first aspect.

In the gas barrier film according to the second aspect, a water vapor transmission rate of the laminate may be 0.01 g/(m²·day) or less.

Advantageous Effects of Invention

According to the above aspect, a laminate and a gas barrier film that can prevent occurrence of flaws in the atomic layer deposition film which is disposed on at least one surface of the substrate can be prevented.

According to the above aspect, by providing a protective film on the surface of the atomic layer deposition film that covers the substrate, the protective film serves as the substrate that protects one surface of the atomic layer deposition film. As a result, occurrence of flaws on one surface of the atomic layer deposition film can be prevented. Specifically, flaws formed by an external force and having a depth from one surface of the atomic layer deposition film to the substrate can be prevented.

Accordingly, for example, when the laminate is transported and stored in a rolled shape, it is possible to prevent a decrease in gas barrier properties and exhibit a desired durability and gas barrier properties. That is, a risk of occurrence of flaws in the atomic layer deposition film which allows gas leakage in the film thickness direction of the atomic layer deposition film can be reduced. Accordingly, high durability and gas barrier properties of the laminate and the gas barrier film formed from the laminate can be maintained, and a barrier film with high reliability can be provided.

DESCRIPTION OF REPRESENTATIVE EMBODIMENTS

With reference to the drawings, an embodiment of the present invention will be described in detail. It is to be understood that the embodiments described below are representative of the present invention, and the present invention is not necessarily limited to the embodiments. The drawings used for the following description are provided for describing a configuration of an embodiment of the present invention, and the size, thickness, dimensions or the like of the illustrated components may be different from those of the actual laminate.

First Embodiment

<Laminate>

Figure 1:
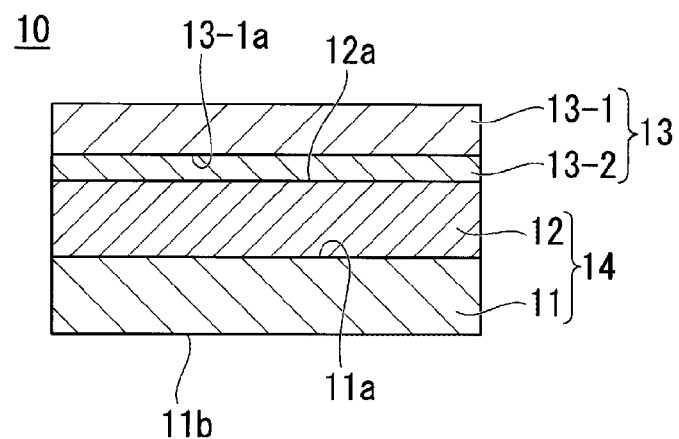
FIG. 1 is a schematic view that illustrates in cross-section a structure of a laminate according to a first embodiment of the present invention.

FIG. 1 is a schematic cross-sectional view that illustrates a structure of a laminate according to a first embodiment of the present invention.

Referring to FIG. 1, a laminate 10 according to the present embodiment is a film-shaped laminate, and includes a substrate 11, an atomic layer deposition film 12 and a protective film 13.

The substrate 11 and the atomic layer deposition film 12 constitute a two-layer laminate 14. In use of the laminate 10 as a packaging material for electronics such as electroluminescent elements and precision parts, the protective film 13 is peeled off from the atomic layer deposition film 12.

<Substrate>

The substrate 11 includes a first surface (one surface) 11a on which the atomic layer deposition film 12 is formed and a second surface (the other surface) 11b which is disposed opposite to the first surface 11a. When the two-layer laminate 14 is used for electronics of solar cells and electroluminescent elements (organic EL elements), the substrate 11 is preferably transparent taking into consideration the optical properties and the like.

The substrate 11 may be, for example, a film-shaped substrate. In this case, the substrate 11 may be made of a material such as a polymer material.

Examples of the polymer material for the substrate 11 include, but are not limited to, polyethylene terephthalate (PET), polyethylene naphthalate (PEN), polyimide film (PI), polyethylene (PE), polypropylene (PP), polystyrene (PS).

The polymer material for the substrate 11 may be appropriately selected in view of heat resistance, physical properties, electric insulation and the like. The substrate 11 preferably has, for example, a glass transition point (Tg) of 50° C. or more.

When the two-layer laminate 14 is used as a packaging material for electronics such as electroluminescent elements and precision parts, the thickness of the substrate 11 is preferably set as appropriate in the range of 12 μm or more and 200 μm or less in view of appropriateness of the packaging material.

<Atomic Layer Deposition Film>

The atomic layer deposition film 12 is made of an inorganic material and is disposed so as to cover the first surface 11a of the substrate 11. The atomic layer deposition film 12 is a film produced by atomic layer deposition (ALD) method. The atomic layer deposition film 12 serves as a gas barrier layer (barrier layer).

The atomic layer deposition film 12 produced by ALD method has good barrier properties (for example, water vapor transmission rate (WVTR) of the order of $10^{-3}$ g/(m²·day) or less).

The atomic layer deposition film 12 may be, for example, configured with an inorganic single-layer film of an inorganic oxide film, inorganic nitride film or an inorganic oxynitride film, an inorganic laminated film made of two or more of the inorganic oxide film, the inorganic nitride film and the inorganic oxynitride film, or an inorganic mixed film. In this case, the inorganic oxide film, the inorganic nitride film, the inorganic oxynitride film, and the inorganic mixed film that constitute the atomic layer deposition film 12 may include at least one of Al, Ti, Si, Zn, Sn, Zr, Hf, and Ta.

By providing the inorganic oxide film, the inorganic nitride film, the inorganic oxynitride film, and the inorganic mixed film that include at least one of Al, Ti, Si, Zn, Sn, Zr, Hf, and Ta to constitute the atomic layer deposition film 12, the atomic layer deposition film 12 having high water vapor barrier properties and high durability can be obtained.

The inorganic oxide film may be, for example, any of $AlO_x$ film ($1.0 \leq X \leq 1.5$), $TiO_x$ film ($1.0 \leq X \leq 2.0$), $SiO_x$ film ($1.0 \leq X \leq 2.0$), $ZnO_x$ film ($1.0 \leq X \leq 2.0$), and $SnO_x$ film ($1.0 \leq X \leq 2.0$).

The inorganic nitride film may be, for example, $SiN_x$ film ($1.0 \leq X \leq 1.3$).

Considering the water vapor barrier properties, durability and cost, a film containing at least one of the elements Al, Si, and Ti (for example, the films listed above) is preferably used as the atomic layer deposition film 12. Using a film containing such an element for the atomic layer deposition film 12 can achieve high water vapor barrier properties and high durability, and reduce the cost.

Preferably, the thickness of the atomic layer deposition film 12 is, for example, in the range of 2 nm or more and 500 nm or less.

When the thickness of the atomic layer deposition film 12 is less than 2 nm, there is a risk that sufficient barrier properties cannot be obtained since the atomic layer deposition film is too thin to function as a barrier film.

On the other hand, when the thickness of the atomic layer deposition film 12 is larger than 500 nm, a stress due to the thick atomic layer deposition film concentrates on the atomic layer deposition film. Consequently, a crack may occur on the atomic layer deposition film, leading to a decrease in barrier properties of the atomic layer deposition film. Further, when the thickness of the atomic layer deposition film 12 is larger than 500 nm, there is a risk of increase in the cost and extension in the film formation time. Further, when the thickness of the atomic layer deposition film 12 is larger than 500 nm, it is generally more difficult to ensure a sufficient transparency of the two-layer laminate 14 if priority is placed on transparency of the two-layer laminate 14.

Accordingly, when the thickness of the atomic layer deposition film 12 is in the range of 2 nm or more and 500 nm or less, the atomic layer deposition film with sufficient barrier properties can be obtained while reducing the cost, film formation time and crack occurrence.

<Protective Film>

The protective film 13 is detachably attached to the outer surface (first surface) 12a of the atomic layer deposition film 12 and covers the outer surface 12a of the atomic layer deposition film 12. When the laminate 10 is used as a gas barrier film, the protective film 13 of the present embodiment is a film to be peeled off from the outer surface 12a of the atomic layer deposition film 12 that constitutes the two-layer laminate 14.

The protective film 13 has high barrier properties and serves to prevent flaws or pinholes from being formed by an object directly touching the thin outer surface 12a of the atomic layer deposition film 12, which may decrease the gas barrier properties of the atomic layer deposition film 12.

The protective film 13 has a structure in which at least a portion that is in contact with the outer surface 12a of the atomic layer deposition film 12 has adhesiveness (adhesive layer).

In the protective film 13, an adhesive force of the adhesive layer (a portion having adhesiveness) (for example, an adhesive layer 13-2 in the case of the protective film 13 formed of a protective film main body 13-1 and the adhesive layer 13-2 as described below) is set to be in the range of 10 cN/25 mm or more and less than 200 cN/25 mm before and after the laminate 10 is taken up by the laminate take-up section 23 shown in FIG. 2 and described later.

Figure 2:
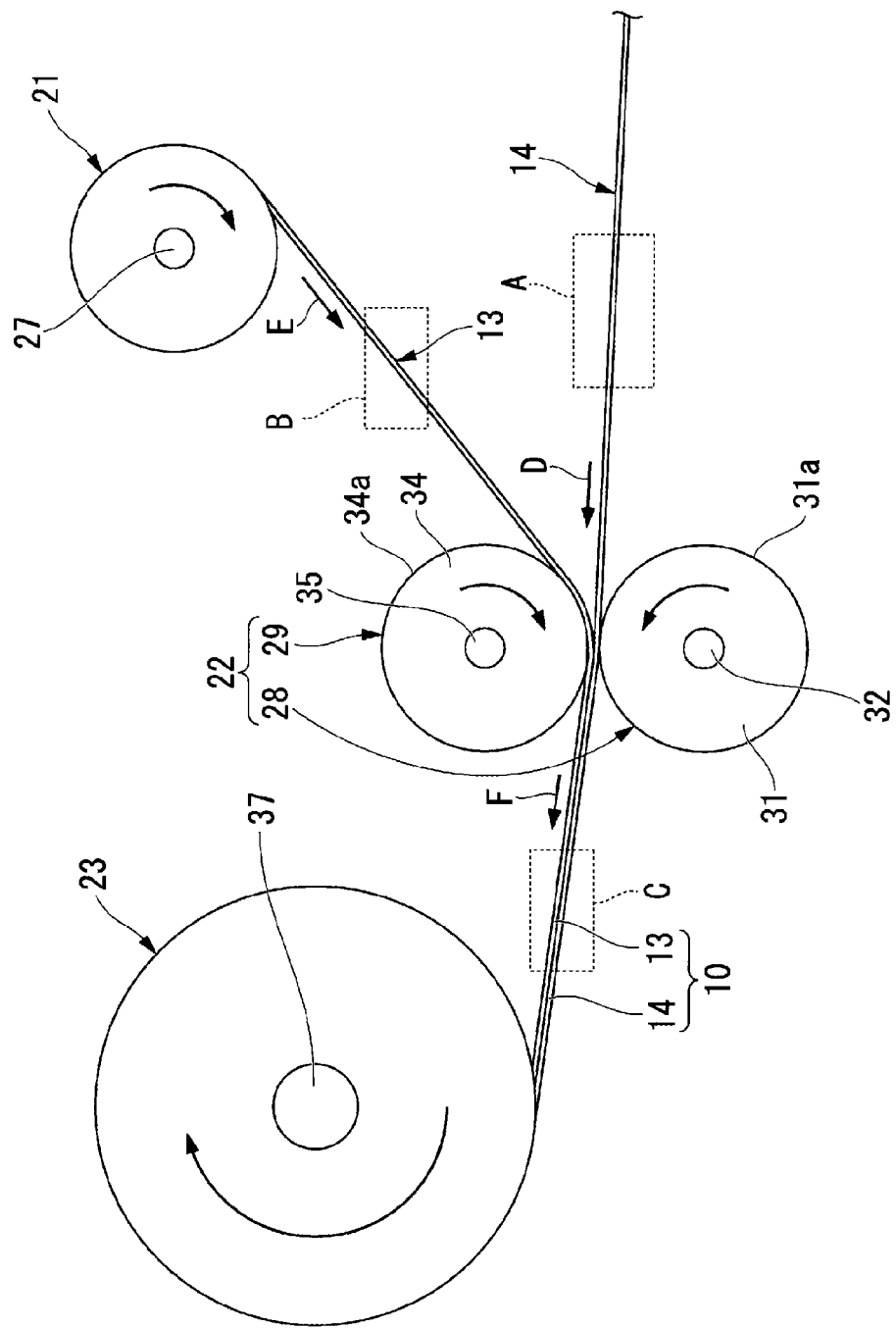
FIG. 2 is a schematic view of an essential part of a roll-to-roll type transportation device, in which the roll-to-roll type transportation device takes up the laminate shown in FIG. 1 by a laminate take-up section.

Further, the adhesive force of the adhesive layer 13-2 varies little before and after the laminate 10 is taken up by the laminate take-up section 23 shown in FIG. 2.

When the adhesive force of the adhesive layer is less than 10 cN/25 mm, the adhesive force of the protective film 13 to the outer surface 12a of the atomic layer deposition film 12 cannot be sufficiently obtained.

For example, when the protective film 13 is hit by an object with the adhesive force of the adhesive layer being less than 10 cN/25 mm, the protective film 13 is peeled off from the outer surface 12a of the atomic layer deposition film 12. Further, when the substrate 11 having the atomic layer deposition film 12 formed on the first surface 11a is taken up by a roll-to-roll type transportation device (see FIG. 2 described below), the protective film 13 may be displaced from the outer surface 12a of the atomic layer deposition film 12, and the outer surface 12a of the atomic layer deposition film 12 is rubbed with the protective film 13. As a result, the outer surface 12a of the atomic layer deposition film 12 is damaged, which causes difficulty in obtaining high gas barrier properties.

On the other hand, when the adhesive force of the adhesive layer is 200 cN/25 mm or more, the adhesive force is too large to be used in the laminate of a type that is used by peeling off the protective film. Consequently, it is difficult to peel the protective film 13 from the outer surface 12a of the atomic layer deposition film 12 with ease.

As a result, a large amount of force is required to peel the protective film 13, and such a large force applied on the substrate 11 on which the atomic layer deposition film 12 is formed may damage the two-layer laminate 14.

Therefore, when used as a laminate of the type that is used by peeling off the protective film as in the present embodiment, occurrence of flaws (including pinholes) on the outer surface 12a of the atomic layer deposition film 12 can be better prevented (a sufficient protective effect of the protective film 13 to the outer surface 12a of the atomic layer deposition film 12 can be obtained) by setting the adhesive force of the adhesive layer to be at 10 cN/25 mm or more and less than 200 cN/25 mm as in the present embodiment.

Further, when the adhesive force is in the range of 10 cN/25 mm or more and less than 200 cN/25 mm, the protective film 13 can be more easily peeled off from the outer surface 12a of the atomic layer deposition film 12 without damaging the two-layer laminate 14.

A variety of protective films having adhesiveness used for manufacturing functional films may be used as the protective film 13.

The protective film 13 may be, for example, the protective film 13 having the adhesive layer 13-2 formed on the first surface 13-1a of the protective film main body 13-1 as shown in FIG. 1, or the protective film (not shown) which has adhesiveness in the protective film per se.

When the protective film 13 having a structure shown in FIG. 1 is used, the adhesive layer 13-2 may be formed, for example, by applying an adhesive agent which serves as a base material of the adhesive layer 13-2.

The protective film main body 13-1 may be, but is not limited to, a polyester resin, polyolefin resin, acrylic resin or the like.

The polyester resin may be, for example, polyethylene terephthalate (PET). The polyolefin resin may be, for example, polyethylene (PE), polypropylene (PP) or the like. The acrylic resin may be, for example, polymethyl methacrylate.

The adhesive agent which serves as a base material of the adhesive layer 13-2 may be, but is not limited to, acrylic adhesive agent, urethane adhesive agent, rubber-based adhesive agent, silicone adhesive agent, fluorine-based adhesive agent or the like.

The adhesive layer 13-2 may be formed by applying a composition to which a solvent is added on the first surface 13-1a of the protective film main body 13-1. In this case, examples of a method of applying the composition include, but are not limited to, die coater method, gravure roll coater method, spray coater method and the like.

Further, examples of the adhesive layer 13-2 may be copolymers such as ethylene-vinyl acetate copolymer, ethylene-methyl methacrylate copolymer, ethylene-α-olefin copolymer and the like, and a mixture thereof. In this case, the adhesive layer 13-2 may be formed, for example, by co-extrusion of the protective film main body 13-1 and the adhesive layer 13-2.

When the protective film 13 is made of a film which has adhesiveness in the protective film per se, the resin which serves as a base material of the protective film main body 13-1 may be, but is not limited to, a thermoplastic resin having good adhesiveness to the adhesive layer 13-2.

The thermoplastic resin which serves as a base material of the protective film main body 13-1 may be, for example, polyolefin resin such as polyethylene and polypropylene.

Preferably, the thickness of the protective film 13 is, for example, in the range of 10 μm or more and 200 μm or less.

When the thickness of the protective film 13 is less than 10 μm, it is difficult to handle the protective film 13. Accordingly, a crease may be created on the protective film 13 when the protective film 13 is bonded to the outer surface 12a of the atomic layer deposition film 12. Such a crease of the protective film 13 is transferred to the substrate 11 on which the atomic layer deposition film 12 is formed when the laminate 10 is taken up by the take-up section 23 (see FIG. 2) of a roll-to-roll type transportation device 20 which is shown in FIG. 2 and described later. As a result, deformation, distortion, rubbing or the like occurs on the laminate 10 and damages the atomic layer deposition film 12, leading to a decrease in barrier properties of the atomic layer deposition film 12.

On the other hand, when the thickness of the protective film is larger than 200 μm, a large amount of winding tension (larger than that for a thin protective film 13) needs to be applied to the laminate 10 when the laminate 10 is taken up by the laminate take-up section 23 of the roll-to-roll type transportation device 20 shown in FIG. 2.

Such a large amount of winding tension applied on the laminate 10 causes tight winding of the laminate 10 which has been taken up by the laminate take-up section 23, and generates a large force in a direction of a core 37 (see FIG. 2) of the laminate take-up section 23.

This may damage the atomic layer deposition film 12 of the laminate 10 adjacent to the core 37 of the laminate take-up section 23, leading to a decrease in barrier properties of the atomic layer deposition film.

Therefore, damage to the atomic layer deposition film 12 in taking up of the laminate 10 by the laminate take-up section 23 (see FIG. 2) can be reduced by having the protective film 13 with the thickness of 10 μm or more and 200 μm or less. As a result, the atomic layer deposition film 12 that constitutes the laminate 10 which has been taken up by the laminate take-up section 23 has gas barrier properties at a similar level to the gas barrier properties of the atomic layer deposition film 12 immediately after film formation.

Further, considering the thickness and weight of the laminate 10 after it is taken up along with the protective film 13 bonded thereto, the thickness of the protective film 13 is more preferably in the range of 10 μm or more and 100 μm or less.

Moreover, when the thickness of the protective film 13 is in the range of 10 μm or more and 200 μm or less, the thickness of the adhesive layer in the protective film 13 (the adhesive layer 13-2 in the structure shown in FIG. 1) is preferably in the range of, for example, 5 μm or more and 30 μm or less.

When the thickness of the adhesive layer is less than 5 μm, the adhesiveness of the protective film 13 to the outer surface 12a of the atomic layer deposition film 12 becomes insufficient, which may cause the protective film 13 to be peeled off from the outer surface 12a of the atomic layer deposition film 12 when the laminate 10 is taken up by the laminate take-up section 23 (see FIG. 2).

On the other hand, when the thickness of the adhesive layer is larger than 30 μm, it is difficult to ensure a sufficient thickness of the protective film 13 that protects the outer surface 12a of the atomic layer deposition film 12, leading to a decrease in protective performance of the protective film main body 13-1 to the outer surface 12a of the atomic layer deposition film 12.

Therefore, damage to the atomic layer deposition film 12 can be reduced by having the protective film 13 with the thickness of 10 μm or more and 200 μm or less, and the adhesive layer in the protective film 13 with the thickness of 5 μm or more and 30 μm or less.

Accordingly, it is possible to reduce a decrease in gas barrier properties of the atomic layer deposition film 12 after the laminate is taken up by using the take-up roller.

According to the laminate of the present embodiment, the protective film 13 that is detachably attached to the outer surface 12a of the atomic layer deposition film 12 and covers the outer surface 12a of the atomic layer deposition film 12 is provided. The protective film 13 has an adhesive layer that is in contact with the outer surface 12a of the atomic layer deposition film 12, and the adhesive force of the adhesive layer is set to be in the range of 10 cN/25 mm or more and less than 200 cN/25 mm. Accordingly, during take up of the laminate 10, the outer surface 12a of the atomic layer deposition film 12 is prevented from being rubbed with the protective film 13 due to the protective film 13 being displaced from the outer surface 12a of the atomic layer deposition film 12. Further, during peeling of the protective film 13 from the outer surface 12a of the atomic layer deposition film 12, unnecessary force is prevented from being applied on the two-layer laminate 14.

As a result, occurrence of flaws (including a pinholes) on the outer surface 12a of the atomic layer deposition film 12 can be prevented (a sufficient protective effect of the protective film 13 to the outer surface of the atomic layer deposition film 12 can be obtained). Further, the protective film 13 can be easily peeled off from the outer surface 12a of the atomic layer deposition film 12 without damaging the two-layer laminate 14.

In the present embodiment, the description has been given by means of an example having the atomic layer deposition film 12 provided only on the first surface 11a of the substrate 11. However, the present invention can be applied to, for example, a three-layer laminate having the atomic layer deposition films 12 provided on both surfaces (the first surface 11a and the second surface 11b) of the substrate 11.

In this case, the same effect as that of the laminate 10 of the present embodiment can be obtained by providing the protective film 13 on the outer surface of the atomic layer deposition film formed on the second surface 11b of the substrate 11. Preferably, the thickness of the atomic layer deposition film 13 is, for example, in the range of 10 nm or more and 100 nm or less.

Further, the same effect as that of the present embodiment can also be obtained by providing the atomic layer deposition film 12 on the second surface 11b, not on the first surface 11a, and providing the protective film 13 on the outer surface 12a of the atomic layer deposition film 12.

Further, an undercoat layer (not shown) made of an inorganic material containing an inorganic substance having a functional group may be provided between the substrate 11 and the atomic layer deposition film 12 that constitute the laminate 10.

Thus, by providing the undercoat layer (not shown) between the substrate 11 and the atomic layer deposition film 12, sufficient gas barrier properties can be obtained since an increased amount of dense two-dimensional growth of the atomic layer deposition film 12 is formed even if the atomic layer deposition film 12 has small thickness.

<Gas Barrier Film>

The gas barrier film (not shown) has a structure which includes the laminate 10 shown in FIG. 1, and the substrate 11 is configured with a film-shaped substrate. The gas barrier film may be composed of, for example, only the laminate 10, or alternatively, may be configured to have an undercoat layer (not shown) disposed between the substrate 11 and the atomic layer deposition film 12 that constitute the laminate 10.

The above-mentioned gas barrier film with the protective film 13 being peeled off is used in various fields such as food packaging, pharmaceutical products, electronics and agricultural materials.

According to the gas barrier film having the above configuration, the same effect as that of the laminate 10 described above can be obtained.

<Production Method of Laminate>

FIG. 2 is a schematic view which illustrates an essential part of a roll-to-roll type transportation device, in which the roll-to-roll type transportation device takes up the laminate shown in FIG. 1 by a laminate take-up section. In FIG. 2, the same components as those shown in FIG. 1 are denoted by the same reference numbers. In FIG. 2, the arrows illustrated around a core 27 which constitutes the protective film supplying unit 21, rotation shafts 32 and 35 which constitute the protective film attaching unit 22, and a core 37 which constitutes the laminate take-up section 23 each indicate the rotation direction of the cores 27, 37 and the rotation shafts 32, 35.

Further, in FIG. 2, a direction D is a movement direction of the two-layer laminate 14, a direction E is a supply direction of the protective film 13 supplied from the protective film supplying unit 21, and a direction F is a movement direction of the laminate 10 which has been formed by passing through the protective film attaching unit 22.

Figure 3:
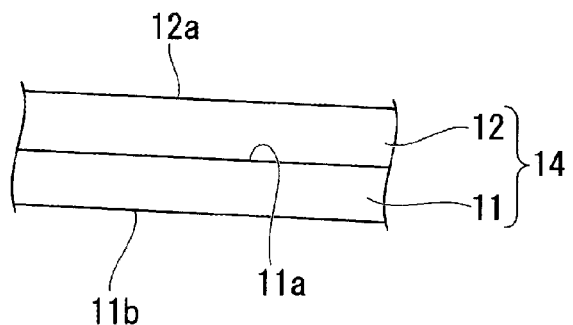
FIG. 3 is an enlarged side view of a portion of a two-layer laminate which is surrounded by a region A shown in FIG. 2.
Figure 4:
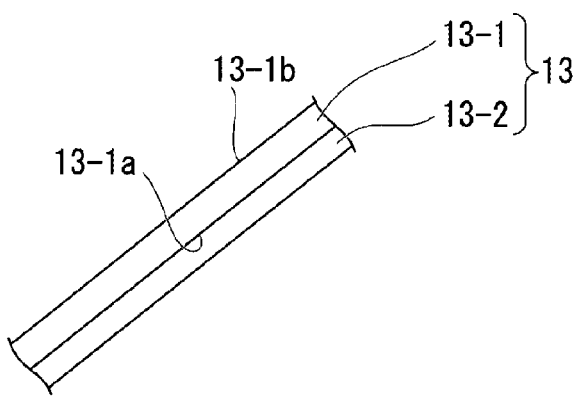
FIG. 4 is an enlarged side view of a portion of a protective film which is surrounded by a region B shown in FIG. 2.
Figure 5:
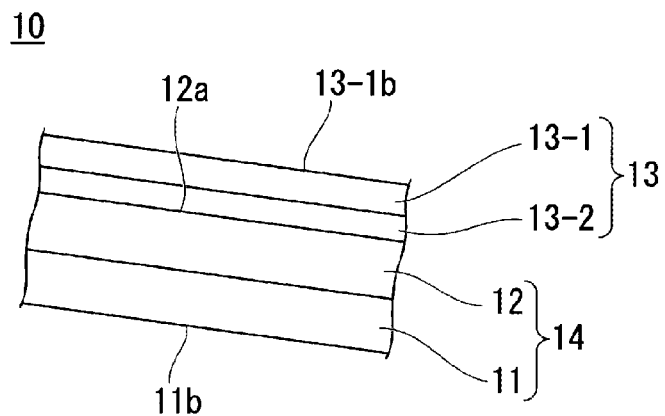
FIG. 5 is an enlarged side view of a portion of the laminate which is surrounded by a region C shown in FIG. 2.

FIG. 3 is an enlarged side view of a portion of the two-layer laminate which is surrounded by a region A shown in FIG. 2. FIG. 4 is an enlarged side view of a portion of the protective film which is surrounded by a region B shown in FIG. 2. FIG. 5 is an enlarged side view of a portion of the laminate which is surrounded by a region C shown in FIG. 2.

In FIGS. 3 to 5, the same components as those shown in FIGS. 1 and 2 are denoted by the same reference numbers.

Next, with reference to FIGS. 2 to 5, a production method of the laminate 10 by using the roll-to-roll type transportation device 20 and a laminate production apparatus (not shown) having an ALD apparatus (not shown) will be briefly described.

First, the atomic layer deposition film 12 is formed on the first surface 11a of the substrate 11 by ALD method (hereinafter, this step is referred to as an "atomic layer deposition film forming step" for the convenience of explanation).

One example of a forming method of the atomic layer deposition film 12 will be described below by means of an example in which a $TiO_2$ film is formed as the atomic layer deposition film 12 on the first surface 11a of the substrate 11 in the atomic layer deposition film forming step.

First, a film deposition chamber (not shown) of an ALD apparatus (not shown) is set to a vacuum state (for example, a pressure of the film deposition chamber is in the range of 10 to 50 Pa). Then, titanium tetrachloride ($TiCl_4$) as source gas, $N_2$ as process gas, $O_2$ and $N_2$ as purge gas, and $O_2$ as reactive gas as well as plasma discharge gas are supplied, and plasma discharge is performed in an ICP mode during supply of the reactive gas and plasma discharge gas.

The above process is repeated until the thickness of the $TiO_2$ film becomes a desired thickness to thereby form the atomic layer deposition film 12 made of the $TiO_2$ film. Thus, the two-layer laminate 14 shown in FIG. 3 is formed.

Next, a configuration of an essential part of the roll-to-roll type transportation device 20 shown in FIG. 2 will be described.

The roll-to-roll type transportation device 20 includes a protective film supplying unit 21, a protective film attaching unit 22, and a laminate take-up section 23 (take-up roller).

The protective film supplying unit 21 is provided at a stage before the protective film attaching unit 22. The protective film supplying unit 21 includes the core 27 of a cylindrical shape on which the protective film 13 shown in FIG. 4 is wound.

As the protective film supplying unit 21 rotates while a predetermined tension is applied on the protective film 13 disposed between the protective film supplying unit 21 and the protective film attaching unit 22, the protective film 13 is supplied from the protective film supplying unit 21 to the protective film attaching unit 22. Here, the protective film 13 is supplied to the protective film attaching unit 22 with the adhesive layer 13-2 being provided as the underside of the protective film 13.

The protective film attaching unit 22 is composed of a pair of rollers 28 and 29 that sandwiches the two-layer laminate 14 and the protective film 13. The roller 28 includes a roller main body 31, and a rotation shaft 32 that supports the roller main body 31 in a rotatable manner. The roller main body 31 includes a roller surface 31a that is in contact with the second surface 11b of the substrate 11 that constitutes the two-layer laminate 14.

The roller 29 includes a roller main body 34 and a rotation shaft 35. The roller main body 34 includes a roller surface 34a that is in contact with the second surface 13-1b (a surface located opposite to the first surface 13-1a) of the protective film main body 13-1 that constitutes the two-layer laminate 14. The roller surface 31a and the roller surface 34a are opposed to each other so as to sandwich the two-layer laminate 14 and the protective film 13.

The roller surfaces 31a and 34a serve to press the adhesive layer 13-2 that constitutes the protective film 13 against the outer surface 12a of the atomic layer deposition film 12 that constitutes the two-layer laminate 14.

As the rotation shafts 32 and 35 rotate in opposite directions, the laminate 10 is supplied in the direction (the direction F) toward the laminate take-up section 23 which is disposed at a stage after the protective film attaching unit 22.

The laminate take-up section 23 is provided at a stage after the protective film attaching unit 22. The laminate take-up section 23 includes the core 37 of a cylindrical shape on which the laminate 10 shown in FIG. 5 is wound.

Next, with reference to FIGS. 2 to 5, procedures subsequent to the atomic layer deposition film forming step will be described.

The two-layer laminate 14 formed in the atomic layer deposition film forming step is guided by the protective film attaching unit 22 in the D direction. When the two-layer laminate 14 reaches the roller main body 31 that constitutes the protective film attaching unit 22, the second surface 11b of the substrate 11 that constitutes the two-layer laminate 14 comes into contact with the roller surface 31a of the roller main body 31.

While the two-layer laminate 14 is formed, the protective film 13 is supplied from the protective film supplying unit 21 in the direction E toward between the roller main bodies 31 and 34. Here, the protective film 13 is supplied to the protective film attaching unit 22 with the adhesive layer 13-2 located as the underside of the protective film 13.

When the two-layer laminate 14 and the protective film 13 are pressed by the roller surfaces 31a and 34a at a position between the roller main bodies 31 and 34, the protective film 13 is bonded to the outer surface 12a of the atomic layer deposition film 12.

The two-layer laminate 14 which is bonded to the protective film 13 that has passed through between the roller main bodies 31 and 34 is taken up by the core 37 that constitutes the laminate take-up section 23. Thus, the laminate 10 wound around the core 37 is produced.

When the laminate 10 is wound around the core 37, the second surface 13-1b (a surface located opposite to the first surface 13-1a) of the protective film main body 13-1 and the second surface 11b of the substrate 11 are in contact with each other.

The laminate 10 according to the present embodiment can prevent occurrence of flaws on the atomic layer deposition film 12 as described above when the laminate 10 is wound around the rotating core 37 that constitutes the laminate take-up section 23.

Second Embodiment

With reference to the drawings, second embodiment of the present invention will be described.

Figure 6:
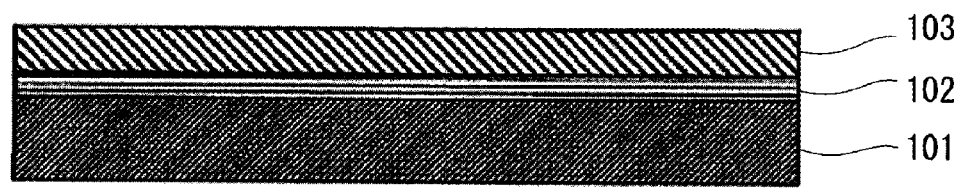
FIG. 6 is a cross-sectional view that illustrates a configuration of a laminate according to a second embodiment of the present invention.

FIG. 6 is a cross sectional view that illustrates a configuration of a laminate according to the present embodiment.

As shown in FIG. 6, the laminate is composed of a substrate 101, an atomic layer deposition film 102 formed on one surface (outer surface) of the substrate 101, and a protective film 103 having an adhesive layer bonded to the atomic layer deposition film 102. The protective film 103 is formed of, for example, the substrate layer and the adhesive layer.

The substrate 101 is a film-shaped substrate made of a plastic material, and is preferably transparent. For example, plastic materials such as polyethylene terephthalate (PET), polyethylene naphthalate (PEN), polyimide film (PI), polyethylene (PE), polypropylene (PP) and polystyrene (PS) may be used. Further, plastic materials are not limited to the above, and may be appropriately selected in view of heat resistance, physical properties, electric insulation and the like.

A glass-transition temperature (Tg) of the substrate 101 is preferably 50° C. or more, but not limited thereto.

A thickness of the substrate 101 is preferably in the range of 12 μm or more and 200 μm or less in view of appropriateness of the packaging material for electronics such as electroluminescence elements and precision parts, and processing appropriateness of the gas barrier film.

The atomic layer deposition film 102 is a film formed by ALD method.

The atomic layer deposition film 102 may be inorganic oxide film, inorganic nitride film, and inorganic oxynitride film of $AlO_x$, $TiO_x$, $SiO_x$, $ZnO_x$, $SnO_x$ and the like, or a mixed film of these elements and films. Further, the atomic layer deposition film 102 may be inorganic oxide film, inorganic nitride film, and inorganic oxynitride film made of other elements, or a mixed film of these films.

The thickness of the atomic layer deposition film 102 is preferably in the range of 2 nm or more and 500 nm or less, and more preferably, in the range of 2 nm or more and 100 nm or less. When the film thickness of the atomic layer deposition film 102 is less than 2 nm, a sufficient function as a gas barrier layer cannot be performed. On the other hand, when the film thickness of the atomic layer deposition film 102 is larger than 500 nm, a crack is easily formed on the gas barrier layer or control of optical properties becomes difficult.

Although the atomic layer deposition film 102 formed on the surface of the substrate 101 has good barrier properties, flaws or pinholes may occur in the atomic layer deposition film 102 by an external contact or the like when the film thickness of the atomic layer deposition film 102 is thin. This may cause a decrease in gas barrier properties of the laminate.

Therefore, in order to prevent occurrence of flaws or pinholes in the atomic layer deposition film 102 due to an external contact or the like and improve the durability, the laminate is formed by bonding the protective film 103 to the surface of the atomic layer deposition film 102.

Here, corona treatment, plasma treatment, ozone treatment or the like is preferably applied on the surface of the atomic layer deposition film 102 as a pretreatment to improve adhesiveness to the protective film 103.

The protective film 103 is a film that protects the atomic layer deposition film 102, and is attached to and in contact with the surface of the atomic layer deposition film 102.

Unlike the first embodiment, the protective film 103 in the second embodiment of the present invention is a portion of the laminate and is not intended to be peeled off after it is bonded. Accordingly, in the present embodiment, the adhesive force is set to be higher than that of the first embodiment.

Further, the protective film is not specifically limited as long as it has a protective function, and a variety of protective films having adhesiveness used for manufacturing functional films may be used.

Accordingly, the protective film 103 may be a film formed by applying an adhesive agent on the substrate, or alternatively, may be a film which has adhesiveness in the protective film per se. The protective film 103 is only required to have an adhesive layer on an adhering surface to the atomic layer deposition film 102.

When the protective film 103 is a film having an adhesive agent applied on the substrate layer, examples of the substrate may be, but are not limited to, polyester resin such as polyethylene terephthalate (PET), polyolefin resin such as polyethylene (PE) and polypropylene (PP), and acrylic resin such as polymethyl methacrylate. Further, the adhesive agent may be, but is not limited to, acrylic adhesive agent, urethane adhesive agent, rubber-based adhesive agent, silicone adhesive agent, fluorine-based adhesive agent or the like. Further, the adhesive agent may be applied by using a composition to which a solvent is added. In this case, examples of a method of applying the adhesive layer include, but are not limited to, die coater method, gravure roll coater method, spray coater method and the like.

Further, in the protective film 103, when the protective film itself has adhesiveness, a resin used as a substrate may be any thermoplastic resin as long as it has good adhesiveness to the adhesive layer. For example, the resin may be, but is not limited to, polyolefin resins such as polyethylene and polypropylene. Further, the adhesive layer may be, but is not limited to, copolymers such as ethylene-vinyl acetate copolymer, ethylene-methyl methacrylate copolymer, ethylene-α-olefin copolymer and the like, and a mixture thereof. The production method may be, but is not limited to, extrusion of the substrate layer and the adhesive layer.

In the second embodiment, since the protective film 103 is a portion of the laminate and is not intended to be peeled off after it is bonded, the adhesive force of the protective film 103 is preferably 200 [cN/25 mm] or more. When the adhesive force of the protective film 103 is less than 200 [cN/25 mm], lifting or detachment due to some external factors may occur on the protective film 103 after it is bonded, which is undesirable in view of a decrease in gas barrier properties.

In the present embodiment, the adhesive force of the protective film 103 is not specifically limited as far as it is 200 [cN/25 mm] or more. However, the adhesive force may not necessarily be 1000 [cN/25 mm] or more, since there is no risk of occurrence of lifting or detachment when the adhesive force is 200 [cN/25 mm] or more and 1000 [cN/25 mm] or less.

Further, the thickness of the protective film 103 including the adhesive layer is preferably in the range of 10 µm or more and 200 µm or less, and more preferably, in the range of 25 µm or more and 100 µm or less.

When the thickness of the protective film 103 is less than 10 µm, it is difficult to handle the protective film 103. Accordingly, a crease may be created when the protective film 103 is bonded. This is undesirable since the unevenness due to such a crease is transferred to the substrate of the atomic layer deposition film during take up, and causes deformation, distortion, rubbing or the like that may damage the atomic layer deposition film 102 and reduce the barrier properties.

Further, when the thickness of the protective film 103 is more than 200 µm, a winding tension which is larger than that for a thin protective film needs to be applied for winding without slack. However, winding with an increased tension causes tight winding and generates a large force in the core direction. Consequently, a large amount of pressure is applied on the atomic layer deposition film 102, particularly at the winding core of the film. This is undesirable since it may deteriorate the barrier properties. Moreover, this is further undesirable since the cost is relatively high.

Accordingly, in the laminate formed by providing the atomic layer deposition film 102 on the substrate 101 and bonding it to the protective film 103, the atomic layer deposition film 102 is not in direct contact with the other substrates when the laminate is taken up. That is, by providing the protective film 103 on the surface of the atomic layer deposition film 102, gas barrier properties can be maintained after the laminate is taken up in a roll shape. Accordingly, the durability and gas barrier properties of the laminate can be improved.

In the laminate composed of the substrate 101, the atomic layer deposition film 102 and the protective film 103, the atomic layer deposition film 102 is not likely to be damaged by an external force since the protective film 103 is formed on the surface of the atomic layer deposition film 102. That is, a risk of occurrence of a flaw in the atomic layer deposition film 102 which allows gas leakage in the film thickness direction of the atomic layer deposition film 102 can be reduced. Therefore, the laminate can be used as a gas barrier film.

As described above, it is confirmed that barrier properties can be maintained after an accelerated durability test and taking up of the laminate by forming the atomic layer deposition film which is a barrier layer and then bonding the atomic layer deposition film to the protective film having an appropriate adhesiveness.

Therefore, according to the laminate of the present embodiment, the gas barrier properties of the laminate can be improved without being greatly affected by the stress such as environmental change by attaching the protective film to the atomic layer deposition film via the adhesive layer.

While the preferred embodiments of the present invention are described above, the present invention is not limited to these specific embodiments, and various alterations and modifications can be made within the scope of the present invention as defined in the appended claims.

EXAMPLES

Examples and Comparative Examples of the present invention will be described below. However, the present invention is not limited in any way to the following examples.

Examples and Comparative Examples corresponding to the first embodiment will be described.

(Production of Two-Layer Laminate and Laminate of Example 1)

<Production of Two-Layer Laminate of Example 1>

In Example 1, a two-layer laminate having a structure shown in FIG. 3 (hereinafter, the two-layer laminate of Example 1 is referred to as "two-layer laminate 14-1") was produced by the following procedure.

First, a stretched film of polyethylene terephthalate (PET) with a thickness of 100 µm was provided as the substrate 11. Then, the two-layer laminate 14-1 of Example 1 was manufactured by forming a $TiO_2$ film with a thickness of 20 nm as the atomic layer deposition film 12 on the first surface 11a of the substrate 11 by an ALD method by using a batch type ALD film formation apparatus.

For deposition of the $TiO_2$ film, titanium tetrachloride ($TiCl_4$) was used as source gas. Further, at the same time as the supply of source gas, $N_2$ as process gas, $O_2$ and $N_2$ as purge gas, and $O_2$ as reactive gas as well as plasma discharge gas were each supplied into the deposition chamber of the ALD apparatus. The pressure inside the deposition chamber in the ALD apparatus was 21 Pa.

In addition, a power supply of 13.56 MHz was used as a plasma excitation power supply to perform plasma discharge in an ICP mode in the deposition chamber of the ALD device for 60 seconds.

The supply period of each gas was as follows. Specifically, the supply periods of $TiCl_4$ and process gas were 1 second, the supply period of purge gas was 60 seconds, and the supply period of reactive gas which also serves as discharge gas was 5 seconds.

Then, plasma discharge was performed in the ICP mode at the same time as the supply of reactive gas which also serves as discharge gas. The output power of plasma discharge was 250 watts.

Further, as gas purge subsequent to the plasma discharge, $O_2$ (the supply amount was 60 sccm) and $N_2$ (the supply amount was 100 sccm) as purge gas were each supplied for 4 seconds. The film deposition temperature of $TiO_2$ film was 90° C.

The above processes were performed as one cycle, and the film deposition rate of $TiO_2$ film for one cycle was measured. The result was approximately 0.11 nm. The above cycle was performed 176 times to produce a $TiO_2$ film having a thickness of 20 nm. The total of film deposition time was 253 minutes.

<Production of Laminate of Example 1>

In Example 1, a laminate having a structure shown in FIG. 5 (hereinafter, the laminate of Example 1 is referred to as "laminate 10-1") was produced by the following procedure.

Specifically, a protective film (hereinafter, referred to as "protective film G" for the convenience of explanation) which is wound around the core 27 shown in FIG. 2 and composed of a protective film main body made of polyethylene (PE) and an adhesive layer made of ethylene-vinyl acetate copolymer is fed into between a pair of rollers 28 and 29 that constitutes the protective film attaching unit 22, and is pressed by the roller surfaces 28*a* and 29*a* of the pair of rollers 28 and 29 so that the protective film G is bonded to the outer surface 12*a* of the atomic layer deposition film 12 that constitutes the two-layer laminate 14-1.

Then, a structure in which the protective film G is bonded to the two-layer laminate 14-1 is wound around the laminate take-up section 23 having the core 37 with a diameter of 300 mm to thereby produce the laminate 10-1 of Example 1.

Here, the entire thickness of the protective film G was 80 µm, and the thickness of the protective film main body was 60 µm, and the thickness of the adhesive layer was 20 µm.

Table 1 shows the conditions of Examples 1 to 5 and Comparative Examples 1 to 4, that is, film type of the atomic layer deposition film, thickness of the atomic layer deposition film (nm), presence or absence of protective film, the entire thickness of the protective film (µm), type of the protective film main body, thickness of the protective film main body (µm), type of the adhesive layer that constitutes the protective film, and thickness of the adhesive layer (µm).

TABLE 1

| | Film type of the atomic layer deposition film | Thickness of the atomic layer deposition film (nm) | Presence (○) or absence (X) of protective film | Entire thickness of the protective film (µm) | Type of the protective film main body | Thickness of the protective film main body (µm) | Type of the adhesive layer that constitutes the protective film |
|---|---|---|---|---|---|---|---|
| Example 1 | TiO$_2$ film | 20 | ○ | 80 | Polyethylene (PE) | 60 | Adhesive layer made of ethylene-vinyl acetate copolymer |
| Example 2 | TiO$_2$ film | 20 | ○ | 25 | Polyethylene terephthalate (PET) | 20 | Acrylic adhesive layer |
| Example 3 | TiO$_2$ film | 20 | ○ | 40 | Polypropylene (PP) | 30 | Rubber-based adhesive layer |
| Example 4 | TiO$_2$ film | 20 | ○ | 30 | Polypropylene (PP) | 23 | Adhesive layer made of polyolefin |
| Example 5 | AlSiO$_2$ film | 20 | ○ | 80 | Polyethylene (PE) | 60 | Adhesive layer made of ethylene-vinyl acetate copolymer |
| Comparative example 1 | TiO$_2$ film | 20 | X | — | — | — | — |
| Comparative example 2 | TiO$_2$ film | 20 | ○ | 30 | Polyethylene (PE) | 25 | Adhesive layer made of ethylene-vinyl acetate copolymer |
| Comparative example 3 | TiO$_2$ film | 20 | ○ | 60 | Polyethylene (PE) | 53 | Adhesive layer made of ethylene-vinyl acetate copolymer |
| Comparative example 4 | TiO$_2$ film | 20 | ○ | 40 | Polypropylene (PP) | 30 | Acrylic adhesive layer |

| | Thickness of the adhesive layer (µm) | Adhesive force of protective film after being taken up by laminate take-up section (cN/25 mm) | Water vapor transmission rate of two-layer laminate [g/(m$^2$ · day)] | Water vapor transmission rate of laminate after being taken up by laminate take-up section [g/(m$^2$ · day)] |
|---|---|---|---|---|
| Example 1 | 20 | 18 | 5.5 × 10$^{-3}$ | 7.0 × 10$^{-3}$ |
| Example 2 | 5 | 15 | 5.5 × 10$^{-3}$ | 7.2 × 10$^{-3}$ |
| Example 3 | 10 | 160 | 5.5 × 10$^{-3}$ | 7.9 × 10$^{-3}$ |
| Example 4 | 7 | 12 | 5.5 × 10$^{-3}$ | 7.6 × 10$^{-3}$ |
| Example 5 | 20 | 18 | 5.3 × 10$^{-3}$ | 6.9 × 10$^{-3}$ |
| Comparative example 1 | — | — | 5.5 × 10$^{-3}$ | 2.0 × 10$^{-1}$ |
| Comparative example 2 | 5 | 4 | 5.5 × 10$^{-3}$ | 3.6 × 10$^{-2}$ |
| Comparative example 3 | 7 | 260 | 5.5 × 10$^{-3}$ | 3.1 × 10$^{-2}$ |
| Comparative example 4 | 10 | 200 | 5.5 × 10$^{-3}$ | 1.9 × 10$^{-2}$ |

(Production of Two-Layer Laminate and Laminate of Example 2)

<Production of Two-Layer Laminate of Example 2>

In Example 2, the two-layer laminate 14-1 described in Example 1 was produced in the same manner as that described in Example 1.

<Production of Laminate of Example 2>

In Example 2, a laminate of Example 2 (hereinafter, the laminate of Example 2 is referred to as "laminate 10-2") was produced in the same manner as that of Example 1 except that the protective film (hereinafter, referred to as "protective film H" for the convenience of explanation) composed of a protective film main body made of polyethylene terephthalate (PET) and an acrylic adhesive layer formed by a coating method was used.

Here, the entire thickness of the protective film H was 25 μm, and the thickness of the protective film main body was 20 μm, and the thickness of the adhesive layer was 5 μm.

(Production of Two-Layer Laminate and Laminate of Example 3)

<Production of Two-Layer Laminate of Example 3>

In Example 3, the two-layer laminate 14-1 described in Example 1 was produced in the same manner as that described in Example 1.

<Production of Laminate of Example 3>

In Example 3, a laminate of Example 3 (hereinafter, the laminate of Example 3 is referred to as "laminate 10-3") was produced in the same manner as that of Example 1 except that the protective film (hereinafter, referred to as "protective film I" for the convenience of explanation) composed of a protective film main body made of polypropylene (PP) and a rubber-based adhesive layer was used.

Here, the entire thickness of the protective film I was 40 μm, and the thickness of the protective film main body was 30 μm, and the thickness of the adhesive layer was 10 μm.

(Production of Two-Layer Laminate and Laminate of Example 4)

<Production of Two-Layer Laminate of Example 4>

In Example 4, the two-layer laminate 14-1 described in Example 1 was produced in the same manner as that described in Example 1.

<Production of Laminate of Example 4>

In Example 4, a laminate of Example 4 (hereinafter, the laminate of Example 4 is referred to as "laminate 10-4") was produced in the same manner as that of Example 1 except that the protective film (hereinafter, referred to as "protective film J" for the convenience of explanation) composed of a protective film main body made of polypropylene (PP) and an adhesive layer made of polypropylene (PP) was used.

Here, the entire thickness of the protective film J was 30 μm, and the thickness of the protective film main body was 23 μm, and the thickness of the adhesive layer was 7 μm.

(Production of Two-Layer Laminate and Laminate of Example 5)

<Production of Two-Layer Laminate of Example 5>

In Example 5, first, a stretched film of polyethylene terephtalate (PET) with a thickness of 100 μm was provided as the substrate 11. Then, a two-layer laminate of Example 5 (hereinafter, the two-layer laminate of Example 5 is referred to as "two-layer laminate 14-2") was produced by forming an AlSiO$_2$ film with a thickness of 20 nm as the atomic layer deposition film 12 on the first surface 11a of the substrate 11 by ALD method by using a batch type ALD film formation apparatus.

<Production of Laminate of Example 5>

In Example 5, a laminate of Example 5 (hereinafter, the laminate of Example 5 is referred to as "laminate 10-5") was produced in the same manner as that of Example 1 except that the protective film G (the protective film having the same laminate structure and thickness as that in Example 1) was used.

(Production of Two-Layer Laminate and Laminate of Comparative Example 1)

<Production of Two-Layer Laminate of Comparative Example 1>

In Comparative Example 1, the two-layer laminate 14-1 described in Example 1 was produced in the same manner as that described in Example 1.

<Production of Laminate of Comparative Example 1>

In Comparative Example 1, the laminate S1 of Comparative Example 1 was produced by winding the two-layer laminate 14-1 around the laminate take-up section 23 without bonding the protective film to the two-layer laminate 14-1.

(Production of Two-Layer Laminate and Laminate of Comparative Example 2)

<Production of Two-Layer Laminate of Comparative Example 2>

In Comparative Example 2, the two-layer laminate 14-1 described in Example 1 was produced in the same manner as that described in Example 1.

<Production of Laminate of Comparative Example 2>

In Comparative Example 2, a laminate of Comparative Example 2 (hereinafter, the laminate of Comparative Example 2 is referred to as "laminate S2") was produced in the same manner as that of Example 1 except that the protective film (hereinafter, referred to as "protective film K" for the convenience of explanation) composed of a protective film main body made of polyethylene (PE) and an adhesive layer made of ethylene-vinyl acetate copolymer was used.

Here, the entire thickness of the protective film K was 30 μm, and the thickness of the protective film main body was 25 μm, and the thickness of the adhesive layer was 5 μm.

(Production of Two-Layer Laminate and Laminate of Comparative Example 3)

<Production of Two-Layer Laminate of Comparative Example 3>

In Comparative Example 3, the two-layer laminate 14-1 described in Example 1 was produced in the same manner as that described in Example 1.

<Production of Laminate of Comparative Example 3>

In Comparative Example 3, a laminate of Comparative Example 3 (hereinafter, the laminate of Comparative Example 3 is referred to as "laminate S3") was produced in the same manner as that of Example 1 except that the protective film (hereinafter, referred to as "protective film L" for the convenience of explanation) composed of a protective film main body made of polyethylene (PE) and an adhesive layer made of ethylene-vinyl acetate copolymer was used.

Here, the entire thickness of the protective film L was 60 μm, and the thickness of the protective film main body was 53 μm, and the thickness of the adhesive layer was 7 μm.

(Production of Two-Layer Laminate and Laminate of Comparative Example 4)

<Production of Two-Layer Laminate of Comparative Example 4>

In Comparative Example 4, the two-layer laminate 14-1 described in Example 1 was produced in the same manner as that described in Example 1.

<Production of Laminate of Comparative Example 4>

In Comparative Example 4, a laminate of Comparative Example 4 (hereinafter, the laminate of Comparative Example 4 is referred to as "laminate S4") was produced in the same manner as that of Example 1 except that the protective film (hereinafter, referred to as "protective film M" for the convenience of explanation) composed of a protective film main body made of polypropylene (PP) and an acrylic adhesive layer was used.

Here, the entire thickness of the protective film M was 40 µm, and the thickness of the protective film main body was 30 µm, and the thickness of the adhesive layer was 10 µm.

(Measurement of Adhesive Force of Protective Film)

The adhesive force of the protective films G to M that constitute the laminates 10-1 to 10-5 and S2 to S4 of Examples 1 to 5 and Comparative Examples 2 to 4 (adhesive force of the protective films G to M after being taken up by the laminate take-up section 23) was measured.

Specifically, the laminates 10-1 to 10-5 and S2 to S4 were each cut into a strip shape with a 25-mm width to thereby prepare samples. The atomic layer deposition film and the protective film that constitute each sample were peeled by 180 degrees.

Measurement of the adhesive force was conducted by using Tensilon universal testing machine, RTC-1250, manufactured by Orientec Corporation. Further, the peeling speed was 300 mm/min.

The results are shown in Table 1.

(Measurement of Water Vapor Transmission Rate (WVTR))

The water vapor transmission rate of the two-layer laminates 14-1 and 14-2 used in Examples 1 to 5 and Comparative Examples 1 to 4, and the water vapor transmission rate of the laminates 10-1 to 10-5 and S1 to S4 used in Examples 1 to 5 and Comparative Examples 1 to 4 were measured.

Specifically, the water vapor transmission rate was measured in an atmosphere of 40° C./90% RH by using a water vapor transmission rate measurement machine, MOCON Aquatran (registered trademark), manufactured by MOCON Inc.

Further, in measurement of water vapor transmission rate of the laminates 10-1 to 10-5 and S1 to S4 according to Examples 1 to 5 and Comparative Examples 2 to 4, which are the examples and comparative examples corresponding to the first embodiment, the results are shown for the measurement performed with the protective film of the laminate being peeled off after take up of the laminate.

Since the protective film is not attached in Comparative Example 1, the measurement result of the water vapor transmission rate of the laminate S1 is shown.

The results are shown in Table 1.

(Evaluation of Presence and Absence of Flaw in the Laminate)

Laminates 10-1 to 10-5 and S1 to S4 of Examples 1 to 5 and Comparative Examples 1 to 4 were observed by using an optical microscope before and after it was taken up to evaluate flaws in the atomic layer deposition film. An observation area was approximately 2 mm×3 mm. It was confirmed that there are almost no flaws in the atomic layer deposition film of the laminates 10-1 to 10-5 of Examples 1 to 5 and laminates S1 to S4 of Comparative Examples 1 to 4 before the laminate was taken up.

Further, in evaluation of flaws in the atomic layer deposition film after take-up, the observation of the atomic layer deposition film was performed by peeling off the protective film of the samples.

(Evaluation Results)

Referring to Table 1, from the result of Comparative Example 1 which does not include a protective film (during take up), it was confirmed that the water vapor transmission rate, which was $5.5\times10^{-3}$ [g/(m$^2$·day)] before take up, decreases to $2.0\times10^{-1}$ [g/(m$^2$·day)] (in other words, decreases to the order of $10^{-1}$ g/(m$^2$·day)) when the laminate S1 which does not include a protective film was taken up by the protective film laminate take-up section 23.

Further, the number of flaws on the laminate S1 of Comparative Example 1 after take up was approximately 100.

The above result in Comparative Example 1 seems to be caused by the fact that the two-layer laminate 14-1 was not protected during take up since it does not have a protective film during take up.

From the result of Example 4, it was confirmed that the water vapor transmission rate of the laminate 10-4 was maintained to be in the order of $10^{-3}$ g/(m$^2$·day) (specifically, $7.6\times10^{-3}$ [g/(m$^2$·day)]) when the adhesive force of the protective film H after it was taken up by the laminate take-up section 23 was 12 (cN/25 mm).

On the other hand, from the result of Comparative Example 2, it was confirmed that the water vapor transmission rate of the laminate S2 decreased to the order of $10^{-2}$ g/(m$^2$·day) (specifically, $3.6\times10^{-2}$ [g/(m$^2$·day)]) when the adhesive force of the protective film K after it was taken up by the laminate take-up section 23 was 4 (cN/25 mm).

Further, while the number of flaws in the atomic layer deposition film of the laminate 10-4 of Example 4 after it was taken up was approximately 3, the number of flaws in the atomic layer deposition film of the laminate S2 of Comparative Example 2 after it was taken up was approximately 40.

From these results, it was confirmed that a too small adhesive force of the protective film (in this case, 4 (cN/25 mm)) decreases a performance as a protective film, leading to a decrease in the water vapor transmission rate after take up.

From the result of Example 3, it was confirmed that the water vapor transmission rate of the laminate 10-3 was maintained to be in the order of $10^{-3}$ g/(m$^2$·day) (specifically, $7.9\times10^{-3}$ [g/(m$^2$·day)]) when the adhesive force of the protective film I after it was taken up by the laminate take-up section 23 was 160 (cN/25 mm).

On the other hand, from the results of Comparative Examples 3 and 4, it was confirmed that the water vapor transmission rate (with the protective film of the laminate peeled off after it was taken up) decreased to the order of $10^{-2}$ g/(m$^2$·day) when the adhesive force of the protective films L and M after they were taken up by the laminate take-up section 23 was 200 (cN/25 mm) or more.

From the above results, it was confirmed that the adhesive force of the protective film needs to be less than 200 (cN/25 mm).

Further, while the number of flaws on the atomic layer deposition film of the laminate 10-3 of Example 3 after it was taken up was approximately 5, the number of flaws on the atomic layer deposition film of the laminate S3 of Comparative Example 3 after it was taken up was approximately 30, and the number of flaws on the atomic layer deposition film of the laminate S4 of Comparative Example 4 after it was taken up was approximately 50.

From these results, it was confirmed that the number of flaws on the atomic layer deposition film of the laminates S3 and S4 of Comparative Examples 3 and 4 was approximately 6 times larger than that of the laminate 10-3 of Example 3.

From the results of Examples 1 and 5, it was confirmed that the water vapor transmission rate of the laminate 10-5 (with the protective film of the laminate peeled off after it was taken up) was maintained to be in the order of $10^{-3}$ g/(m²·day) (specifically, 6.9×$10^{-3}$ [g/(m²·day)]) even if the film type of the atomic layer deposition film in the laminate was replaced with $AlSiO_2$ film from $TiO_2$ film.

From the results of Examples 1 to 5, it was confirmed that polyethylene, polyethylene terephthalate and polypropylene may be used for the protective film main body, and an adhesive layer made of ethylene-vinyl acetate copolymer, an acrylic adhesive layer, a rubber-based adhesive layer, and an adhesive layer made of polyolefin may be used for the adhesive layer.

Next, a specific example of the laminate manufactured according to the second embodiment will be described. Here, a film formation method of the gas barrier layer formed of the atomic layer deposition film 102 will be described.

[Film Formation of Atomic Layer Deposition Film 102]

First, a PET film with a thickness of 100 μm was provided as the substrate 101. Then, a $TiO_2$ film (barrier layer) was formed as the atomic layer deposition film 102 on the surface of the PET film by ALD method by using a batch type ALD apparatus.

For deposition of the $TiO_2$ film, titanium tetrachloride ($TiCl_4$) was used as source gas. Further, at the same time as supply of source gas, $N_2$ as process gas, $O_2$ and $N_2$ as purge gas, and $O_2$ as reactive gas as well as plasma discharge gas were each supplied into the deposition chamber. The pressure in the deposition chamber was 10 to 50 Pa.

In addition, a power supply of 13.56 MHz was used as a plasma excitation power supply to perform plasma discharge in the ICP mode.

The supply period of each gas was as follows. Specifically, the supply periods of $TiCl_4$ and process gas were 1 second, the supply period of purge gas was 60 seconds, and the supply period of reactive gas which also serves as plasma discharge gas was 5 seconds.

Then, plasma discharge was performed in the ICP mode at the same time as supply of reactive gas which also serves as discharge gas. The output power of plasma discharge was 250 watts. Further, as gas purge subsequent to the plasma discharge, $O_2$ (the supply amount was 60 sccm) and $N_2$ (the supply amount was 100 sccm) as purge gas were each supplied for 4 seconds. The film deposition temperature of $TiO_2$ film was 90° C.

The film formation speed of the $TiO_2$ film under the cycle conditions described above was found as follows. That is, since a unit film formation speed was approximately 1.1 Å (angstrom)/cycle, 176 cycles of film formation process were performed to form a film of 20 nm thick. A total period of film formation time was 253 min.

[Water Vapor Transmission Rate and Adhesive Force of Laminate]

Next, Examples will be described for the experimental results on the adhesive force in attachment of the laminate manufactured according to the second embodiment and the water vapor transmission rate (hereinafter, WVTR) before and after the laminate was exposed to temperature and humidity environment settings for an accelerated durability test, and before and after the laminate was taken up by a take-up roller.

The accelerated durability test was performed by using a highly accelerated life testing machine, EHS211MD, manufactured by ESPEC Corp.

The temperature and humidity environment settings were 105° C./100% RH for 96 hours for the laminate strength, and 105° C./100% RH for 24 hours for the water vapor transmission rate.

The adhesive force was measured by 180-degree peeling between the atomic layer deposition film 102 and the protective film 103 of the sample in a strip shape of 25 mm width. Tensilon universal testing machine, RTC-1250, manufactured by Orientec Corporation was used for the test. Further, the peeling speed was 300 mm/min.

Further, the water vapor transmission rate was measured in the atmosphere of 40° C./90% RH by using a water vapor transmission rate measurement machine (MOCON Aquatran (registered trademark) or MOCON Prematran (registered trademark), manufactured by MOCON Inc).

Further, unlike the evaluation in the first embodiment, evaluation of Examples (Examples 6 and 7) and Comparative Examples (Comparative Examples 7 and 8) according to the second embodiment was performed on the measurement results of the water vapor transmission rate of the laminate having the protective film remaining to be attached.

Table 1 shows the comparison of WVTR before and after the durability test of the laminate, and before and after the laminate was taken up.

TABLE 2

| | Barrier layer | Protective film 103 is attached or not | Adhesive force [cN/25 mm] | Water vapor transmission rate [g/(m² · day)] | | |
|---|---|---|---|---|---|---|
| | | | | Initial period | After accelerated durability test | After take up |
| Example 6 | $TiO_2$ film (film thickness: 20 nm) | Attached (film thickness: 40 μm) | 330 | $5.0 \times 10^{-3}$ | $6.9 \times 10^{-3}$ | — |
| Example 7 | $TiO_2$ film (film thickness: 20 nm) | Attached (film thickness: 40 μm) | 330 | $5.0 \times 10^{-3}$ | — | $7.0 \times 10^{-3}$ |
| Comparative Example 5 | $TiO_2$ film (film thickness: 20 nm) | Not attached | — | $5.5 \times 10^{-3}$ | $2.0 \times 10^{-1}$ | — |
| Comparative Example 6 | $TiO_2$ film (film thickness: 20 nm) | Not attached | — | $5.5 \times 10^{-3}$ | — | $9.5 \times 10^{-1}$ |
| Comparative Example 7 | $TiO_2$ film (film thickness: 20 nm) | Attached (film thickness: 30 μm) | 5 | $5.0 \times 10^{-3}$ | $3.6 \times 10^{-2}$ | — |
| Comparative Example 8 | $TiO_2$ film (film thickness: 20 nm) | Attached (film thickness: 30 μm) | 5 | $5.0 \times 10^{-3}$ | — | $3.1 \times 10^{-2}$ |

Referring to FIG. 2, advantages of Examples will be described.

Example 6

In Example 6, the atomic layer deposition film 102 was formed by growing a $TiO_2$ film by approximately 20 nm as a barrier layer on the surface of the substrate 101 which is a PET film of 100 μm thick, and the protective film 103 which was formed by applying a rubber-based adhesive layer on a substrate layer made of polypropylene (PP) was bonded to the atomic layer deposition film 102. The protective film 103 has a thickness of 40 μm, and an adhesive force of 330 cN/25 mm to the atomic layer deposition film.

The WVTR was measured by using the sample having the protective film 103 bonded thereto as described above. The measurements of the WVTR were initially $5.0 \times 10^{-3}$ [g/m$^2$/day] before the accelerated durability test, and then $6.9 \times 10^{-3}$ [g/m$^2$/day] after the accelerated durability test.

Example 7

In Example 7, the atomic layer deposition film 102 was formed by growing a TiO2 film by approximately 20 nm as a barrier layer on the surface of the substrate 101 which is a PET film of 100 μm thick, and the protective film 103 which was formed by applying a rubber-based adhesive layer on a substrate layer made of polypropylene (PP) was bonded to the atomic layer deposition film 102. The protective film 103 has a thickness of 40 μm, and an adhesive force of 330 cN/25 mm to the atomic layer deposition film.

The sample having the protective film 103 bonded thereto as described above was brought into contact with a take-up roller having a 300-mm diameter so as to be taken up by the roller, and the WVTR before and after the taking up was measured. The measurements of the WVTR were $5.0 \times 10^{-3}$ [g/(m$^2$·day)] before the taking up, and $7.0 \times 10^{-3}$ [g/(m$^2$·day)] after the taking up.

Comparative Example

Next, in order to show the advantages in adhesive force and WVTR of the laminate according to the present example, comparison with the comparative examples was made as shown in Table 2.

Comparative Example 5

The sample of Comparative Example 5 has the same configuration as that of Example 6 except for not having the protective film 103.

The WVTR before and after the accelerated durability test was measured by using the sample which does not include the protective film 103. The measurement before the accelerated durability test was $5.5 \times 10^{-3}$ [g/(m$^2$·day)]. The measurement after the accelerated durability test was $9.5 \times 10^{-1}$ [g/(m$^2$·day)].

Comparative Example 6

As in Comparative Example 5, the sample of Comparative Example 6 has the same configuration as that of Example 6 except for not having the protective film 103.

The sample which does not have the protective film 103 was brought into contact with a take-up roller having a 300-mm diameter so as to be taken up by the roller. The WVTR measurement before the taking up was $5.5 \times 10^{-3}$ [g/(m$^2$·day)]. The WVTR measurement after the taking up was $2.0 \times 10^{-1}$ [g/(m$^2$·day)].

Comparative Example 7

In Comparative Example 7, the atomic layer deposition film 102 was formed by growing a TiO$_2$ film by approximately 20 nm as a barrier layer on the surface of the substrate 101 which is a PET film of 100 μm thick, and the protective film which was formed by co-extrusion of a substrate layer made of polyethylene (PE) and an adhesive layer made of ethylene-vinyl acetate copolymer on the atomic layer deposition film 102.

The protective film has a thickness of 30 μm, and an adhesive force of 5 cN/25 mm to the atomic layer deposition film.

The adhesive force and WVTR were measured by using the sample having the protective film bonded thereto as described above. The measurements of the WVTR were initially $5.0 \times 10^{-3}$ [g/(m$^2$·day)] before the accelerated durability test, and then $3.6 \times 10^{-2}$ [g/(m$^2$·day)] after the accelerated durability test.

Comparative Example 8

In Comparative Example 8, the atomic layer deposition film 102 was formed by growing a TiO$_2$ film by approximately 20 nm as a barrier layer on the surface of the substrate 101 which is a PET film of 100 μm thick, and the protective film which was formed by co-extrusion of a substrate layer made of polyethylene (PE) and an adhesive layer made of ethylene-vinyl acetate copolymer on the atomic layer deposition film 102. The protective film has a thickness of 30 μm, and an adhesive force of 5 cN/25 mm to the atomic layer deposition film.

The sample having the protective film bonded there to as described above was brought into contact with a take-up roller having a 300-mm diameter so as to be taken up by the roller. The WVTR before and after the taking up was measured. The measurements of the WVTR were $5.0 \times 10^{-3}$ [g/(m$^2$·day)] before the taking up, and $3.1 \times 10^{-2}$ [g/(m$^2$·day)] after the taking up.

INDUSTRIAL APPLICABILITY

The present invention can be applied to laminates and gas barrier films used for packaging films of electronics such as electroluminescence elements (EL elements), liquid crystal displays and semiconductor wafers, pharmaceutical products and food products, packaging films of precision parts and the like.

REFERENCE SIGNS LIST

10 Laminate; 11 Substrate; 11a First surface (one surface) of substrate; 11b Second surface (the other surface) of substrate; 12 Atomic layer deposition film; 12a Outer surface; 13 Protective film; 13-1 Protective film main body; 13-1a First surface (one surface) of protective film main body; 13-1b Second surface (the other surface) of protective film main body; 13-2 Adhesive layer; 14 Two-layer laminate; 20 Roll-to-roll type transportation device; 21 Protective film supplying unit; 22 Protective film attaching unit; 23 Laminate take-up section; 27, 37 Core; 28, 29 Roller; 31, 34 Roller main body; 31a, 34a Roller surface; 32, 35 Rotation shaft; A to C Region; D to F Direction; 101 Substrate; 102 Atomic layer deposition film; 103 Protective film

What is claimed is:
1. A laminate comprising:
a substrate;
an atomic layer deposition film that is disposed on at least one surface of the substrate; and
a protective film that is bonded to and covers the atomic layer deposition film, and has an adhesive layer that is in contact with the atomic layer deposition film so that the protective film is detachably attached to the atomic layer deposition film, wherein:

an adhesive force of the adhesive layer is in a range 12 cN/25 mm to 160 cN/25 mm;

a thickness of the protective film is in a range of 10 μm or more and 200 μm or less;

a thickness of the adhesive layer in the protective film is in a range of 5 μm or more and 20 μm or less;

a thickness of the atomic layer deposition film is 20 nm; and, the atomic layer deposition film is a single-layer film comprising TiOx, wherein $1.0 \leq X \leq 2.0$ or $AlSiO_2$.

2. The laminate of claim 1, wherein the substrate comprises a transparent plastic material selected from polyethylene terephthalate (PET), polyethylene naphthalate (PEN), polyimide film (PI), polyethylene (PE), polypropylene (PP) and polystyrene (PS) and a thickness of the substrate is in a range of 12 μm or more and 200 μm or less.

3. The laminate of claim 2, wherein the substrate comprises polyethylene terephthalate (PET).

4. The laminate of claim 2, wherein the protective film comprises polyethylene terephthalate (PET), polyethylene (PE) or polypropylene (PP).

5. The laminate of claim 4, wherein the atomic layer deposition film is a $TiO_x$ film, wherein $1.0 \leq X \leq 2.0$.

6. The laminate of claim 1, wherein the protective film comprises a polyester resin, a polyolefin resin or an acrylic resin.

7. The laminate of claim 6, wherein the protective film comprises polyethylene terephthalate (PET), polyethylene (PE) or polypropylene (PP).

8. The laminate of claim 1, wherein the adhesive layer comprises an acrylic adhesive agent, an urethane adhesive agent, a rubber-based adhesive agent, a silicone adhesive agent, or a fluorine-based adhesive agent.

9. The laminate of claim 1, wherein the adhesive layer comprises an acrylic adhesive agent, a rubber-based adhesive agent, a polyolefin adhesive agent or an ethylene-vinyl acetate copolymer adhesive agent.

10. A gas barrier film comprising the laminate of claim 1.

11. The gas barrier film of claim 10, wherein a water vapor transmission rate of the laminate is 0.01 $g/(m^2 \cdot day)$ or less.

* * * * *